United States Patent
Ji

(10) Patent No.: US 7,012,486 B2
(45) Date of Patent: Mar. 14, 2006

(54) MINIATURE WIDEBAND BIAS TEE

(75) Inventor: Daxiong Ji, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 43 days.

(21) Appl. No.: 10/900,119

(22) Filed: Jul. 28, 2004

(65) Prior Publication Data
US 2006/0022771 A1   Feb. 2, 2006

(51) Int. Cl.
*H03H 7/00* (2006.01)

(52) U.S. Cl. ...................................... 333/181; 333/185
(58) Field of Classification Search ............... 333/12, 333/181, 185; 336/200, 205, 232, 234
See application file for complete search history.

(56) References Cited

U.S. PATENT DOCUMENTS

| | | | | |
|---|---|---|---|---|
| 5,189,382 A | * | 2/1993 | Kauffman | 333/169 |
| 5,414,402 A | * | 5/1995 | Mandai et al. | 336/200 |
| 5,495,217 A | * | 2/1996 | Garcia | 333/246 |
| 5,726,612 A | * | 3/1998 | Mandai et al. | 333/184 |

\* cited by examiner

*Primary Examiner*—Seungsook Ham
(74) *Attorney, Agent, or Firm*—Kevin Redmond

(57) ABSTRACT

A miniature wideband bias tee that has a small package size. The bias tee has a low temperature co-fired ceramic substrate with a top surface and a bottom surface. A first inductor is located within the substrate. A second inductor is attached to the top surface and has a core with a wire wound on the core. Terminals are located on the top and bottom surfaces. Ends of the wire are connected to terminals on the top surface. A capacitor is mounted to terminals on the top surface. Several vias extend through the substrate and electrically connect the terminals to the inductor and capacitor.

22 Claims, 7 Drawing Sheets

MINIATURE WIDEBAND BIAS TEE

BACKGROUND

1. Field of the Invention

This invention relates to bias tees used with radio frequency (RF) and microwave frequency signals in general and more particularly to a miniature wideband bias tee that has a small package size and that can be manufactured at low cost.

2. Description of the Related Art

Bias tees are used in various devices. A bias tee is used with radio frequency and microwave frequency signals to couple a direct current (DC) voltage onto a line used for alternating current (AC or RF) signals. A bias tee can also separate a combined RF and DC signal into separate RF and DC signals. The bias tee can remove the DC component of a composite signal in order to isolate a RF component.

Referring to FIG. 1, a schematic diagram of a bias tee 20 is shown. Bias tee 20 has three ports, DC, RF and RF+DC. A low frequency or DC signal is applied to port DC. A high frequency or RF signal is applied to port RF. A combined signal results at port RF+DC. Bias tee 20 has a RF choke or Inductor L1 and a DC blocking capacitor C. Inductor L1 has one end connected to port DC and another end connected to a node N1. Node N1 joins a DC blocking capacitor C with port RF+DC. The other end of capacitor C is connected to port RF. Inductor L1 can be a wire wound on a ferrite core. The parasitic capacitance of the inductor is shown as capacitor C1. The loss of the ferrite core and the resistance of the wire are shown as resistor R1.

For good performance at low frequencies, the inductance L should be large. Unfortunately, when the inductance is large, the parasitic capacitance is also large and the parasitic resistance low. The result is that the electrical performance of the bias tee is poor at high frequencies.

In order to increase the bandwidth performance of bias tee 20 over a larger frequency range, a second inductor L2 in series can be added. Referring to FIG. 2, a schematic diagram of a wideband bias tee 30 is shown. Wideband bias tee 30 is similar to bias tee 20 except that inductor L2 has been added. Inductor L2 has one end connected to port DC and another end connected to node N2. Inductor L2 can be a wire winding wound on a ferrite core. One end of inductor L1 is connected to node N2. The parasitic capacitance of the inductors are shown as capacitors C1 and C2. The loss of the ferrite cores and the resistance of the wires are shown as resistors R1 and R2. Inductor L1 is selected to be large enough for proper low frequency operation. Inductor L2 is selected to be small for high frequency operation. Since inductor L2 has a small value, the parasitic capacitance C2 is small and the parasitic resistance R2 is high. Therefore, bias tee 30 has good performance at both high and low frequencies.

Bias tees have been packaged using multiple ferrite cores mounted on a printed circuit board with lead frames. Unfortunately, the multiple ferrite cores take up excessive space when mounted on a printed circuit board. The mounting of the cores, side by side, results in a large package. A typical bias tee of the prior art has dimensions of 1.26 inches in length by 0.44 inches in width by 0.39 inches in height. The mounting of the cores, windings and lead frame are manual operations that are difficult to automate. It is desirable, in order to reduce cost, to automate as much of the assembly process as possible.

While bias tees have been used, they have suffered from being too large, expensive, difficult to assemble and not easily manufactured using automated equipment. A current unmet need exists for a wideband bias tee that has a smaller size, can be assembled at a low cost and that can be manufactured using automated equipment.

SUMMARY

It is a feature of the invention to provide a miniature wideband bias tee that has a small package size and that can be manufactured at low cost.

A further feature of the invention is to provide a wideband bias tee that includes a substrate having a top surface and a bottom surface. A first inductor is located within the substrate. The inductor has a first and second end. A first, second, third and fourth top terminal are located on the top surface. A first, second and third bottom terminal are located on the bottom surface. A first via is connected between the first top terminal and the first end of the inductor line. A second via is connected between the first bottom terminal and the second end of the inductor line. A third via is connected between the second top terminal and the second bottom terminal. A fourth via is connected between the third top terminal and a conductor pad. A fifth via is connected between the fourth top terminal and the third bottom terminal. A second inductor is attached to the top surface. The second inductor has a core and a wire wound on the core. The wire has a first end connected to the first top terminal and a second end connected to the fourth top terminal. A capacitor has one end mounted to the second top terminal and another end mounted to the third top terminal.

It is noted that the drawings of the invention are not to scale.

DETAILED DESCRIPTION

Figure 3:
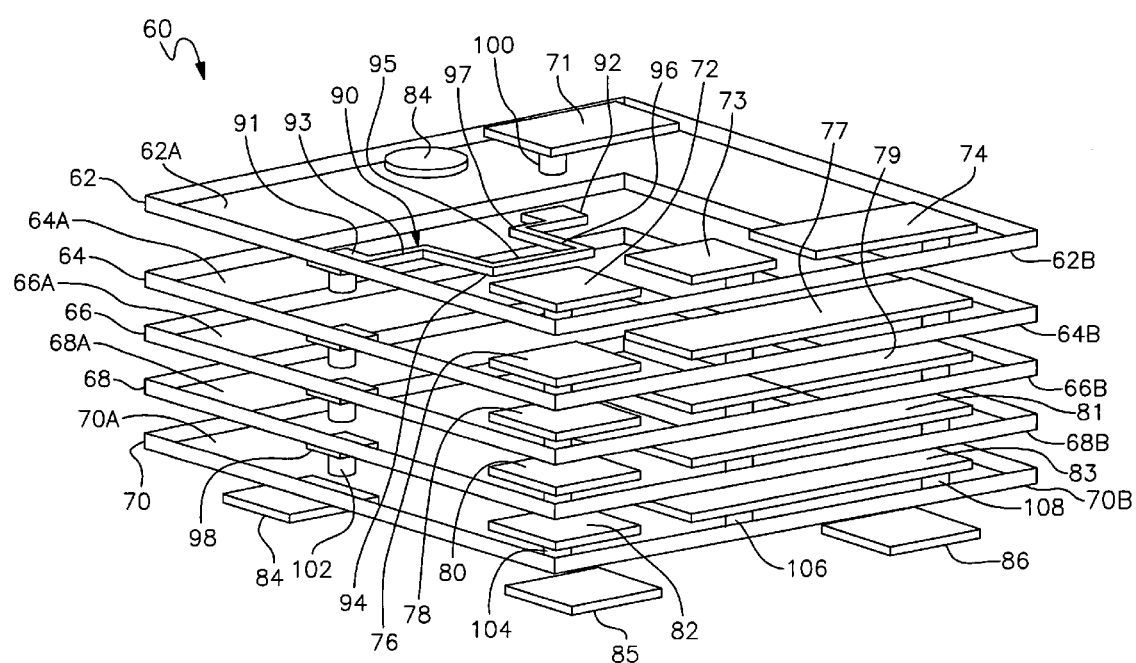
FIG. 3 is an exploded view of the substrate of the present invention.

Referring to FIG. 3, an exploded view of a low temperature co-fired ceramic (LTCC) substrate 60 is shown. Substrate 60 has a top surface 62A and a bottom surface 70B. LTCC substrate 60 is comprised of multiple layers of low temperature co-fired ceramic material. Planar layers 62, 64, 66, 68 and 70 are all stacked on top of each other and form a unitary structure 60 after firing in an oven. LTCC layers 62–70 are commercially available in the form of a green unfired tape from Dupont Corporation. Each of the layers has a top surface, 62A, 64A, 66A, 68A and 70A. Similarly, each of the layers has a bottom surface, 62B, 64B, 66B, 68B and 70B.

The layers have several circuit features that are patterned on the surfaces. Layer 62 has several circuit features that are patterned on surface 62A. Surface 62A has four terminals 71, 72, 73 and 74 and an orientation mark 84. The terminals are electrically connected to vias. Terminal 71 is connected to via 100. Terminal 72 is connected to via 104. Terminal 73 is connected to via 106 and terminal 74 is connected to via 108. The vias extend through some or all of the layers. Via 100 extends through layer 62. Via 102 extends through layers 64–70. Via 104 extends through layers 62–70. Via 106 extends through layers 62–70. Via 108 extends through layers 62–70. The vias are formed from an electrically conductive material and electrically connect one layer to another layer.

Layer 64 has a conductor line 90 located on surface 64A. Conductor line 90 has a wide end 91, another wide end 92 and thin joined segments 93, 94, 95, 96 and 97. Conductor line 90 is U-shaped. Wide end 91 is connected to via 102. Wide end 92 is connected to via 100. Conductor line 90 has an associated inductance and forms inductor L2 in the electrical schematic of FIG. 2. Conductor line 90 is therefore sandwiched between layers 62 and 64. Conductor line 90 can have typical dimensions of 0.152 inches in length, 0.004 inches in width and 0.0005 inches in thickness.

Conductor pads 76 and 77 are located on surface 64A. Conductor pad 77 connects vias 106 and 108. A via pad 98 is located on surfaces 64A, 66A, 68A and 2(70A. Via pad 98 is connected to via 102 and helps to make a more reliable electrical connection between the layers. Conductor pads 78 and 79 are located on surface 66A. Conductor pad 79 connects vias 106 and 108. Conductor pads 80 and 81 are located on surface 68A. Conductor pad 81 connects vias 106 and 108. Conductor pads 82 and 83 are located on surface 70A. Conductor pad 83 connects vias 106 and 108. The conductor pads reduce the inductance between terminals 73 and 86.

Layer 70 has several circuit features that are patterned on surface 70B. Surface 70B has four terminals 84, 85, 86 and 87. Terminal 84 is connected to via 102, terminal 85 is connected to via 104, terminal 86 is connected to via 108.

The circuit features and vias of substrate 60 are formed by screen printing conventional thick film conductor and via materials on the low temperature ceramic layers. The layers are then stacked onto each other and fired in an oven to produce a unitary part.

Figure 1:
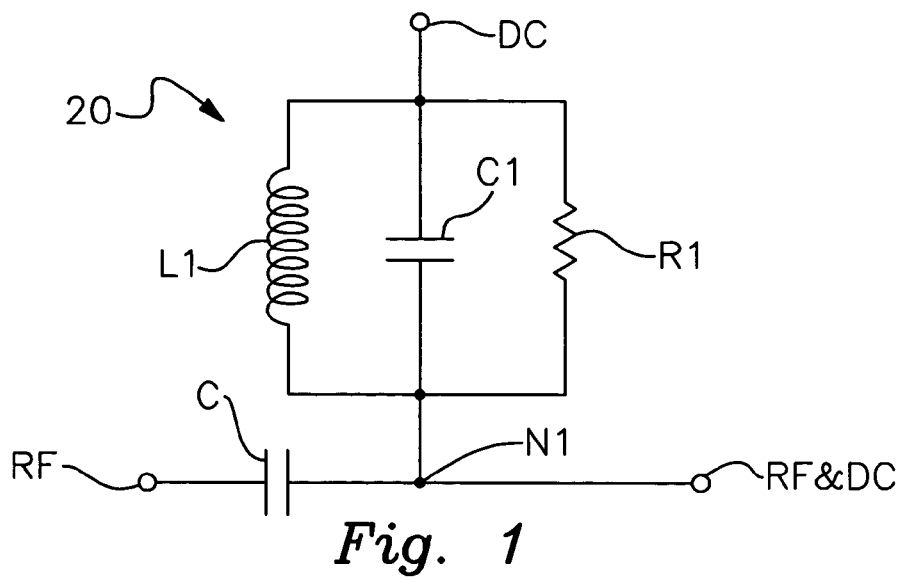
FIG. 1 is an electrical schematic diagram of a bias tee.
Figure 2:
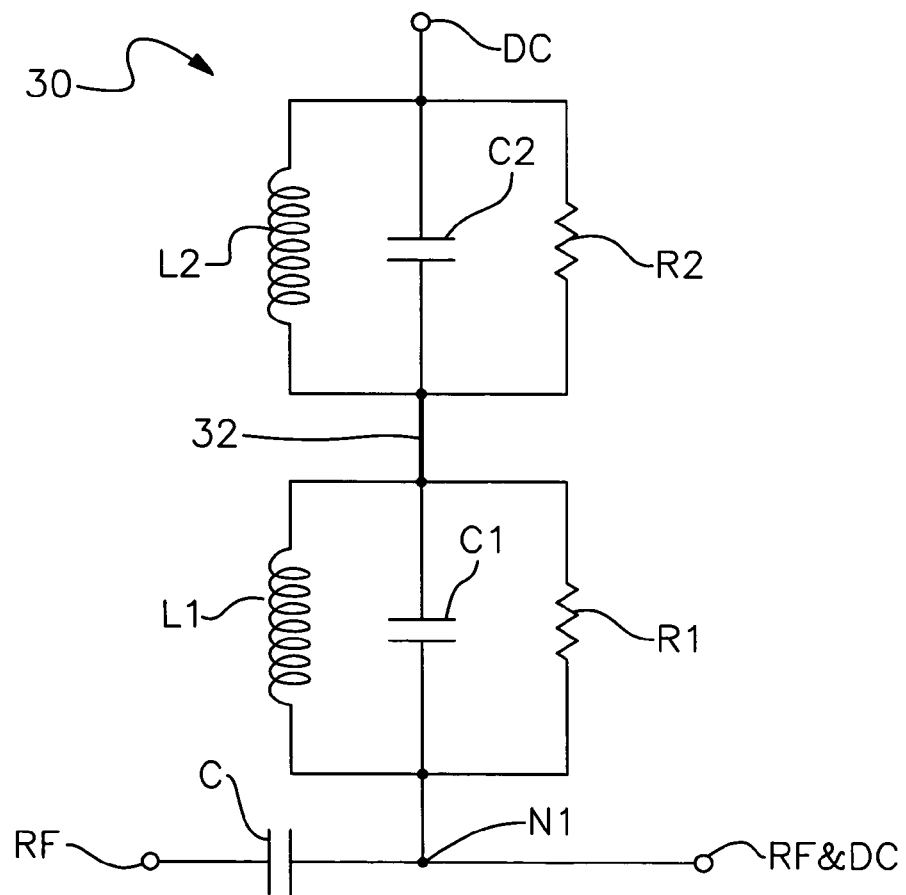
FIG. 2 is an electrical schematic diagram of a wideband bias tee.
Figure 4:
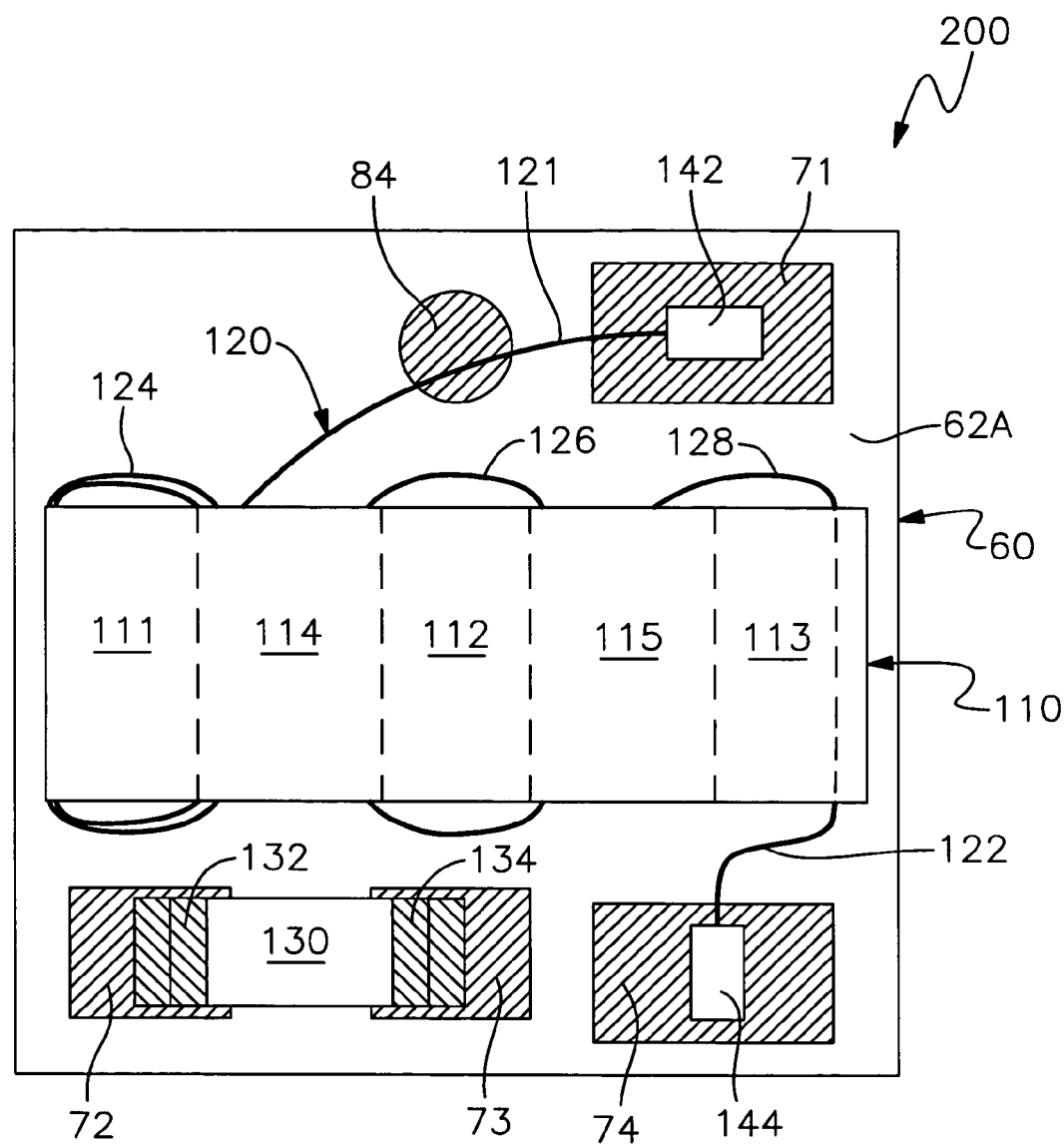
FIG. 4 is a top view of a miniature wideband bias tee in accordance with the present invention.
Figure 5:
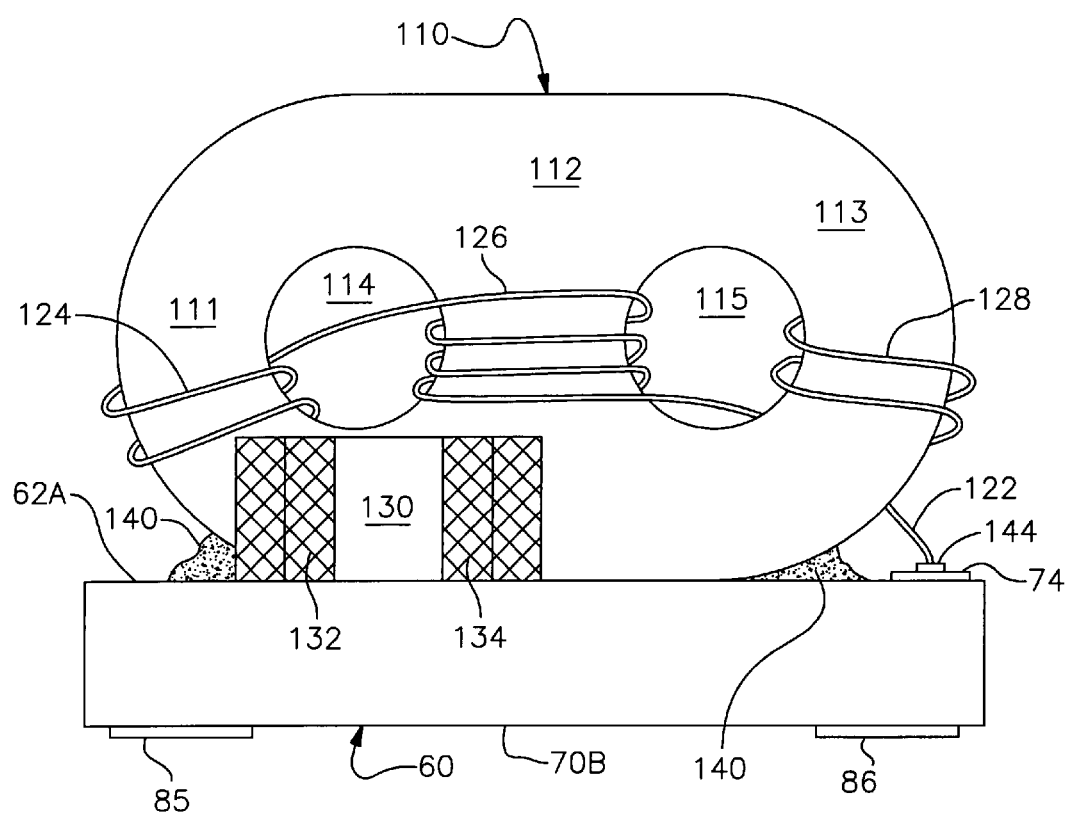
FIG. 5 is a side view of FIG. 4.

Referring to FIGS. 4 and 5, the electrical schematic of the wideband bias tee of FIG. 2 is realized in a physical package in accordance with the present invention. Miniature wideband bias tee 200 has a binocular core 110 mounted to top surface 62A. Core 110 is mounted to surface 62A by an adhesive 140. Adhesive 140 can be an epoxy or other suitable glue. Core 110 is a ferrite binocular core with three legs 111, 112 and 113. Leg 112 is the center leg. Core 110 has apertures 114 and 115.

A wire 120 is wound on core 110. Wire 120 has ends 121 and 122. Wire 120 is wound for 2 turns on leg 111 to form a winding 124. Wire 120 is wound for 4 turns on center leg 112 to form a winding 126. Wire 120 is wound for 2 turns on leg 113 to form a winding 128. The wire ends are attached to terminals 71 and 74 by welding or soldering. Wire end 121 is attached to terminal 71 by weld 142. Wire end 122 is attached to terminal 74 by weld 144. Wire 120 can be 36-gauge magnet wire. Core 110 and wire 120 has an associated inductance and forms inductor L1 in the electrical schematic of FIG. 2.

A DC blocking capacitor 130 is mounted between terminals 72 and 73. DC blocking capacitor 130 has ends 132 and 134. Blocking capacitor 130 is a surface mounted chip capacitor. End 132 is soldered to terminal 72. End 132 is soldered to terminal 74. The DC blocking capacitor has a value of 220 pico-farads. DC blocking capacitor 130 corresponds to capacitor C of FIG. 2.

Bias tee 200 has an overall size of 0.15 inches in length, 0.15 inches in width and less than 0.15 inches in height. Bias tee 200 can be smaller than these dimensions. Bias tee 200 has an area of 0.0225 square inches.

Bias tee 200 would typically be mounted to a printed circuit board (not shown). The terminals 84, 85, 86 and 87 would be attached to the printed circuit board using a reflowed solder paste. Solder paste would be screen printed onto the printed circuit board. Terminals 84, 85, 86 and 87 would be placed onto the solder paste and melted in a re-flow oven to attach the bias tee to the printed circuit board.

Bias tee 200 can be assembled in the following manner:
1. Core 110 is wound with wire 120 to form inductor L1.
2. Adhesive 140 is dispensed onto top surface 62A.
3. Core 110 with windings is placed onto adhesive 140 and cured.
4. Wire ends 121 and 122 are welded to terminals 71 and 74.
5. DC blocking capacitor 130 is soldered onto terminals 72 and 73.
6. The completed assembly is electrically tested.

The present invention has several advantages. Since, inductor L2 or conductor line 90 is integrated into the low temperature co-fired ceramic substrate, it is not mounted separately adjacent to inductor L1 or core 110. This creates a smaller overall package size.

The use of the integrated inductor reduces the number of assembly steps for the bias tee resulting a lower cost of assembly.

By placing inductor L2 within substrate 60, the remaining manufacturing steps can be done using automated equipment. Automated assembly reduces the cost of manufacturing.

Fabricating the bias tee using a low temperature co-fired ceramic substrate results in more uniform electrical characteristics.

A bias tee in accordance with the present invention was built and tested for electrical performance. Inductor L1 had an inductance value of 5 micro-henries at 0 milli-amps of current and 1.1 micro-henries at 100 milli-amps (DC) of current. Inductor L2 had an inductance value of 5.5 nano-henries. DC blocking capacitor 130 had a value of 220 pico-farads. Bias tee 200 can operate over the frequency range of 50 to 6000 MHz.

Figure 8:
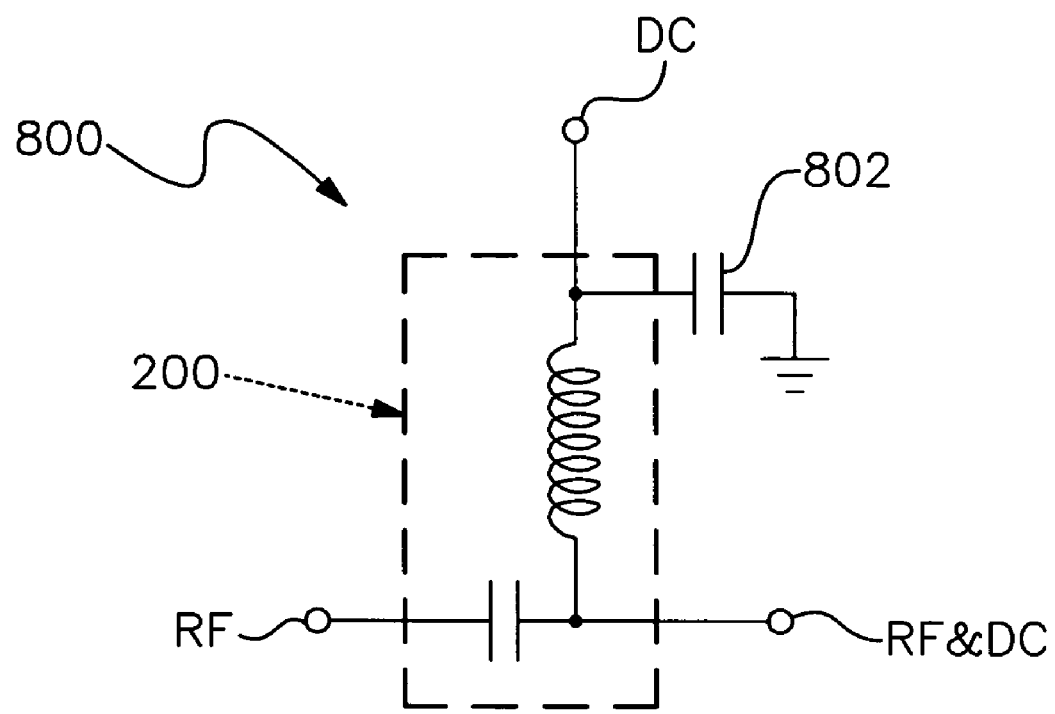
FIG. 8 is an electrical schematic diagram of a test circuit for a bias tee.

FIG. 8 shows an electrical schematic diagram of a test circuit 800 that was used to test bias tee 200. Test circuit 800 has bias tee 200 connected with a capacitor 802. Capacitor 802 is connected between the port DC and ground.

Figure 6:
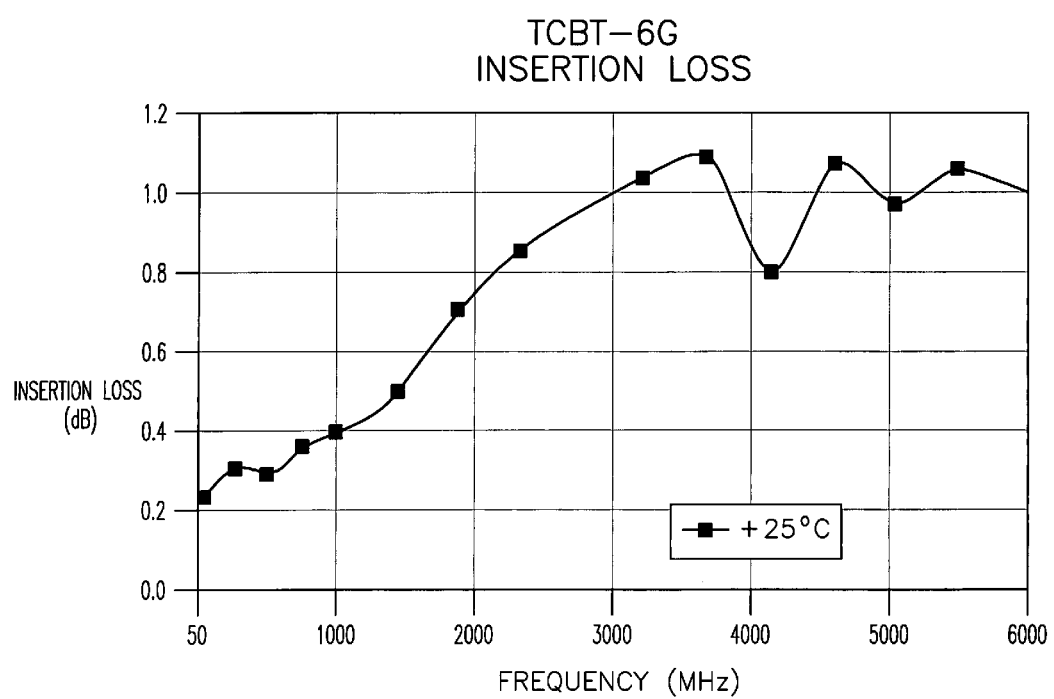
FIG. 6 is a graph showing insertion loss versus frequency for the bias tee of FIG. 4.
Figure 7:
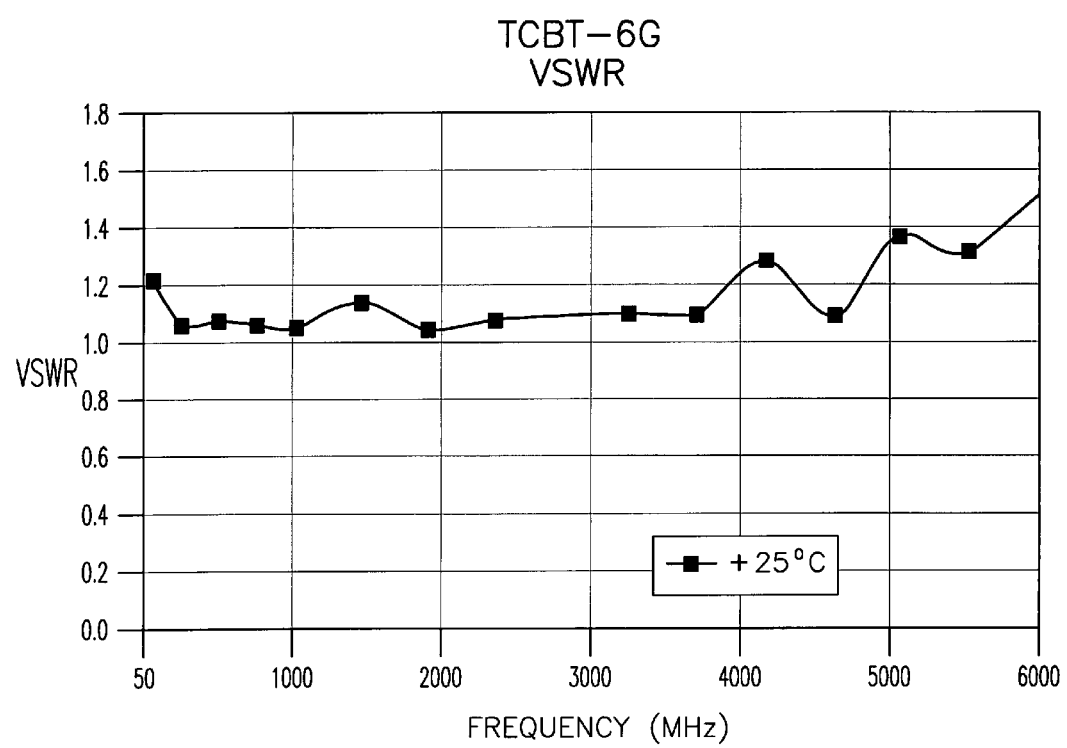
FIG. 7 is a graph showing VSWR versus frequency for the bias tee of FIG. 4.

Referring to FIG. 6, a graph showing the insertion loss for wideband bias tee 200 is shown over the frequency range of from 50 to 6000 MHz. FIG. 7 shows a graph of VSWR versus frequency for wideband bias tee 200. The VSWR was typically 1.1 with a maximum of 1.5.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A bias tee comprising:
 a) a substrate having a top layer, a bottom layer, and a plurality of inner layers;
 b) a conductor line formed on an inner layer, the conductor line having a first and second end;
 c) first, terminal second terminal, third terminal and fourth terminal located on the top layer;
 d) fifth terminal, sixth terminal and seventh terminal located on the bottom layer;
 e) a first via extending through the substrate between the first terminal and the first end of the conductor line;
 f) a second via extending through the substrate between the fifth terminal and the second end of the conductor line;
 g) a third via extending through the substrate between the second terminal and the sixth terminal;
 h) a fourth via extending through the substrate between the third terminal and a conductor pad;
 i) a fifth via extending through the substrate between the fourth terminal and the seventh terminal;
 j) a core attached to the top layer;
 k) a wire having a first end and a second end, the wire wound on the core, the first end connected to the first terminal and the second end connected to the fourth terminal; and
 l) a capacitor mounted to the second and third terminals.

2. The bias tee according to claim 1, wherein the substrate is formed from layers of low temperature co-fired ceramic.

3. The bias tee according to claim 1, wherein the fifth terminal forms a DC port and the sixth terminal forms a RF port and the seventh terminal forms a RF and DC port.

4. The bias tee according to claim 1, wherein the core is a binocular core.

5. The bias tee according to claim 1, wherein the core is attached to the top layer by an adhesive.

6. The bias tee according to claim 1, wherein the core has a first leg, a second leg and a third leg.

7. The bias tee according to claim 6, wherein the wire is wound on the first leg for 2 turns, on the second leg for 4 turns and on the third leg for 2 turns.

8. The bias tee according to claim 6 wherein the core and wire forms a first inductor and the conductor line forms a second inductor, the first and second inductors being series connected.

9. A wideband bias tee comprising:
 a) a substrate having a top surface and a bottom surface;
 b) a first inductor located within the substrate, the inductor having a first and second end;
 c) first top terminal, second top terminal, third top terminal and fourth top terminal located on the top surface;
 d) first bottom terminal, second bottom terminal and third bottom terminal located on the bottom surface;
 e) a first via connected between the first top terminal and the first end of the inductor line;
 f) a second via connected between the first bottom terminal and the second end of the inductor line;
 g) a third via connected between the second top terminal and the second bottom terminal;
 h) a fourth via connected between the third top terminal and a conductor pad;
 i) a fifth via connected between the fourth top terminal and the third bottom terminal;
 j) a second inductor attached to the top surface, the second inductor having a core and a wire wound on the core, the wire having a first end connected to the first top terminal and a second end connected to the fourth top terminal; and
 k) a capacitor having one end mounted to the second top terminal and another end mounted to the third top terminal.

10. The bias tee according to claim 9, wherein the core is attached to the top surface by an adhesive.

11. The bias tee according to claim 9, wherein the conductor pad is also connected to the fifth via.

12. The bias tee according to claim 9, wherein the core is a binocular core.

13. The bias tee according to claim 12, wherein the binocular core has a first leg, a second leg, a third leg and two apertures.

14. The bias tee according to claim 13, wherein the wire is wound on the first leg for 2 turns, on the second leg for 4 turns and on the third leg for 2 turns.

15. The bias tee according to claim 9, wherein the bias tee is less than 0.150 inches in length by 0.150 inches in width by 0.150 inches in height.

16. The bias tee according to claim 9, wherein the first inductor is formed by a conductor line located with the substrate.

17. A bias tee comprising:
 a) a low temperature co-fired ceramic substrate having a first, second, third, fourth and fifth layer;
 b) first terminal, second terminal, third terminal and fourth terminal located on the first layer;
 c) fifth terminal, sixth terminal and seventh terminal located on the fifth layer;
 d) a first inductor attached to the first layer, the first inductor having a core and a wire wound on the core, the wire having one end attached to the first terminal and the other end attached to the fourth terminal;
 e) a second inductor located on the second layer, the second inductor having a conductor line, the conductor line having one end attached to the first terminal and another end attached to the fifth terminal;
 f) a first via connected between the first terminal and one end of the conductor line;
 g) a second via connected between the fifth terminal and another end of the conductor line;
 h) a third via connected between the second terminal and the sixth terminal;
 i) a fourth via connected between the third terminal and a conductor pad;
 j) a fifth via connected between the fourth terminal and the seventh terminal; and
 k) a capacitor having one end mounted to the second terminal and another end mounted to the third terminal.

18. The bias tee according to claim 17, wherein the fifth terminal forms a DC port, the sixth terminal forms a RF port and the seventh terminal forms a RF and DC port.

19. The bias tee according to claim 17, wherein the core is a binocular core.

20. The bias tee according to claim 19, wherein the binocular core has a first leg, a second leg, a third leg and two apertures.

21. The bias tee according to claim 20, wherein the wire is wound on the first leg for 2 turns, on the second leg for 4 turns and on the third leg for 2 turns.

22. The bias tee according to claim 17, wherein the bias tee is less than 0.150 inches in length by 0.150 inches in width by 0.150 inches in height.

* * * * *